Dec. 26, 1967 D. BLITZ ETAL 3,360,744
SAWTOOTH WAVE GENERATOR
Original Filed Nov. 18, 1963
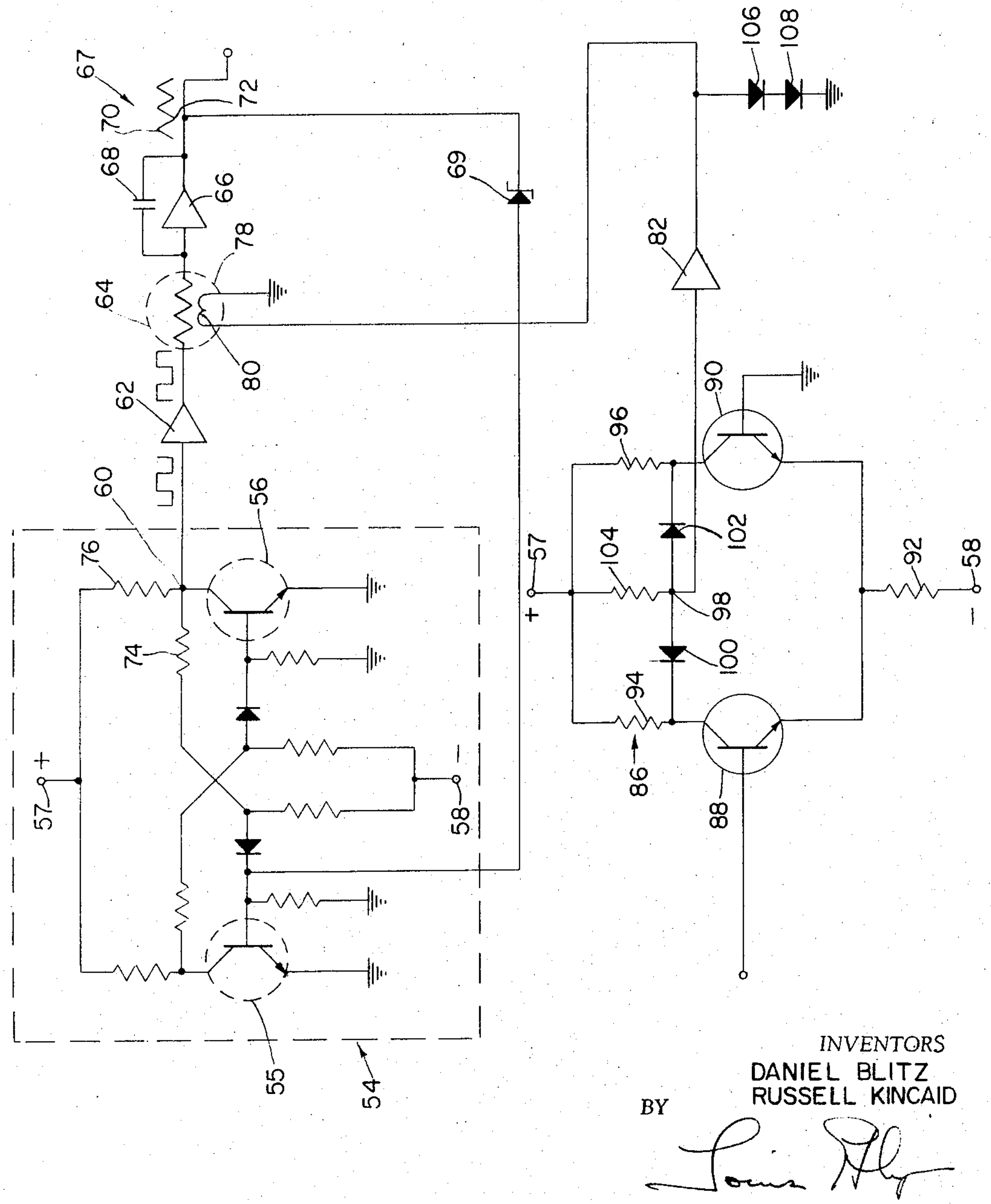
INVENTORS
DANIEL BLITZ
RUSSELL KINCAID
BY

United States Patent Office 3,360,744
Patented Dec. 26, 1967

3,360,744

SAWTOOTH WAVE GENERATOR

Daniel Blitz, Boston, Mass., and Russell Kincaid, Milford, N.H., assignors to Sanders Associates, Inc., Nashua, N.H., a corporation of Delaware Original application Nov. 18, 1963, Ser. No. 324,424. Divided and this application Oct. 23, 1965, Ser. No. 513,892
1 Claim. (Cl. 331—111)

ABSTRACT OF THE DISCLOSURE

Apparatus is herein disclosed for a sawtooth wave generator. The apparatus includes means for providing a square wave and means for integrating the square wave to produce the desired sawtooth. The integrator includes, as the resistor thereof, the resistance element of a phototype variable resistance cell. By varying the filament current to the resistance cell the resistance element thereof changes, which change causes the slope of the sawtooth wave likewise to change. Current for the filament is provided by an amplifier having diodes arranged at the output thereof to prevent filament burnout.

This application is a division of our co-pending patent application, filed Nov. 18, 1963, Ser. No. 324,424, now Patent No. 3,249,938.

Apparatus is required in a great number of applications for generating sawtooth waves. It is often desired to provide sawtooth waves having constant amplitude and variable slope.

Accordingly, it is an object of this invention to provide a unique sawtooth generator.

It is another object of this invention to provide a sawtooth generator for generating sawtooth waves of constant amplitude and variable slope.

The above-mentioned and other features and objects of this invention will become more apparent by reference to the following description, taken in conjunction with the accompanying drawing, which is a block diagram of a sawtooth wave generator.

Referring to the figure, there is disclosed a sawtooth wave generator according to the invention. It includes a conventional flip-flop, indicated at 54, comprising a pair of cross-coupled transistors 55 and 56. The flip-flop has power supply terminals 57 and 58 connected to power sources (not shown) having the indicated polarities with respect to ground. It is caused to change state periodically in a manner described below, and thus it operates as a square wave generator. The output terminal 60 of the flip-flop 54 is at the collector of the transistor 56 and the signal from this terminal is passed through an amplifier 62.

The square wave output of the amplifier 62 is applied to an integrator which includes a series resistor 64 connected to the input of an operational amplifier 66. The amplifier 66 is provided with a feedback path comprising a capacitor 68. The integrator provides at the output terminals of this amplifier a signal which is the integral of the output of the amplifier 62. Since the latter signal is a square wave, the integrated signal has a triangular waveform, shown at 67, suitable for control of the phase shifter 38 for operation in the manner described above.

It should be noted that the height of the triangular wave at any given instant is a function of the resistance $R_{64}$ and the capacitance $C_{68}$, and thus the slope of this waveform is also a function of these parameters. As described below $R_{64}$ is varied to change this slope, and thus change the rate of phase shift in the phase shifter 38.

Alternation of the flip-flop 54 between its two states is provided by means of feedback from the output of the amplifier 66 to the base of the transistor 55. The feedback path comprises a Zener diode 69 connected to oppose the output voltage of the amplifier 66. This voltage may be assumed to range between zero and a positive level. Operation of the circuit is then as follows.

Assume that initially, the transistor 55 is cut off and the transistor 56 is conducting, so that the terminal 60 is essentially at ground potential. By virtue of inversion in the amplifier 66, the output of this amplifier is increasing linearly with time. When the potential of this latter signal exceeds the breakdown voltage of the diode 69, the latter conducts and this current passes through the base-emitter junction of the transistor 55 to initiate collector-emitter conduction in the transistor.

By virtue of the cross-coupling arrangement, the transistor 55 rapidly assumes full conduction and at the same time the transistor 56 is cut off. The potential at the terminal 60 thus rises as does the potential at the output of the amplifier 62. In turn, the output voltage of the amplifier 66 stops increasing and begins to decrease, as indicated at 70 on the triangular waveform 67. This voltage continues to decrease linearly with respect to time until it reaches zero.

At this point forward conduction of the diode 69 brings the base of the transistor 55 to ground potential, thereby cutting off this transistor and causing the flip-flop 54 to change state, with the transistor 56 again conducting. This brings the output voltage of the amplifier 62 back to zero and the output of the integrator once again increases linearly with respect to time, as indicated at 72. The cycle of operation periodically repeats to provide a continuous triangular waveform of constant peak amplitude at the output of the amplifier 66. The time of initiation of each cycle is dependent on the slope of the triangular waveform, and therefore controlling the slope by variation in $R_{64}$ causes the frequency to change in a manner consistent with keeping the amplitude constant.

The diode 69 conducts in the forward direction for an appreciable period of time prior to cutting off the transistor 55. During this time the output voltage of the flip-flop 54 should not change significantly. This can be accomplished by making the resistance of the cross-coupling resistor 74 substantially greater than the resistance of the collector resistor 76. Alternatively, the amplifier 62 might be a hard-limiting device, such as a second flip-flop controlled by the flip-flop 54.

As noted above, the slope of the triangular waveform can be varied, without changing its amplitude, by controlling the resistance of the resistor 64. For this purpose we prefer to use a photo-type variable resistance cell 78 in which the resistance element is the resistor 64. The cell 78 which may be of the type manufactured by Raytheon Company under the designation CK1114 includes a filament 80 which illuminates the resistor 64. The resistor is a semi-conductor and light from the filament 80 injects charge carriers into it, thereby lowering its resistance. Thus, the resistance of the resistor 64 is inversely related to the current in the filament 80.

An amplifier, generally indicated at 86, provides an output signal which is proportional to the magnitude of the input signal and independent of the polarity thereof.

More specifically, the amplifier 86 includes a pair of transistors 88 and 90 connected in the common emitter configuration and jointly using an emitter resistor 92. The emitter resistor 92 and collector resistors 94 and 96 are connected, respectively, to the power supply terminals 58 and 57. The output terminal 98 of the amplifier 86 is the junction of a pair of diodes 100 and 102, connected, as shown, to the collectors of the transistors 88 and 90. A resistor 104 is connected between the terminals 57 and 98.

The input signal of the amplifier 86 is applied between the bases of the transistors 88 and 90 and thus increases the collector current in one transistor and decreases the collector current in the other. The total current through the two transistors remains essentially constant by virtue of the biasing action of the common resistor 92. Assuming that the collector current through the transistors 88 and 90 are increased and decreased respectively, the voltage at the collector of the transistor 88 will drop while the voltage at the collector of the transistor 90 will rise. Thus, there is a current through the resistor 104 by way of the diode 100 and the potential at the terminal 98 drops.

On the other hand, if the input signal is of the opposite polarity, the collector current in the transistor 90 will increase and the current through the transistor 88 will decrease. There will then be an increase in current through the resistor 104, but this time by way of the diode 102, and again the potential at the terminal 98 will drop. Thus, the change of potential at the terminal 98 is the same regardless of the polarity of the input signal of the amplifier 86. The magnitude of the change of potential at the terminal 98 depends on the magnitude of the input signal.

The output signal of the amplifier 86 is amplified by the amplifier 82, which also serves as an inverter.

A pair of diodes 106 and 108 are connected in series across the output terminals of the amplifier 82 and arranged to conduct in the direction of the output voltage of the amplifier. When this voltage is low, the forward resistance of the diodes is sufficiently large to cause essentially all of the output current of the amplifier to pass through the filament 80. However, when the voltage approaches the burnout level of the filament 80, the resistance of the diodes drops appreciably, so as to apply a significant shunt path in parallel with the filament. This serves to protect the filament 80 against burnout.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claim is intended to cover all of the generic and specific features of the invention herein described, and all statements of the scope of the invention, which, as a matter of language, might be said to fall therebetween.

We claim:

A sawtooth wave generator comprising, (a) a square wave generator, (b) means coupled to the output of said square wave generator for integrating the signal from said square wave generator, (c) a photo-type variable resistance cell having a semiconductor resistance element and a filament, the resistance element being coupled to said square wave generator and forming a portion of said integrating means, (d) means for applying current to said filament of said resistance cell to vary the resistance thereof, said means for applying current including an amplifier the output from which is proportional to the magnitude of the input signal and independent of the polarity thereof, said amplifier including a pair of transistors connected in the common emitter configuration, said transistors having a common emitter resistor and separate collector resistors, including an output terminal coupled to said filament, and including a pair of diodes one each connected between said output terminal and the collectors of said transistors.

References Cited

UNITED STATES PATENTS

| | | | |
|---|---|---|---|
| 2,726,331 | 12/1965 | Robinson | 328—181 |
| 2,748,272 | 5/1956 | Schorock | 328—127 |
| 2,841,712 | 7/1958 | Hoge et al. | 331—113 |
| 3,047,820 | 7/1962 | Lawton | 331—143 |
| 3,138,767 | 6/1964 | Levin | 328—181 |
| 3,256,426 | 6/1966 | Roth et al. | 328—127 |

JOHN KOMINSKI, *Primary Examiner.*

ROY LAKE, *Examiner.*